United States Patent
Cordier et al.

(10) Patent No.: US 6,693,785 B1
(45) Date of Patent: Feb. 17, 2004

(54) ELECTRONIC COMPONENT WITH REDUCED INDUCTIVE COUPLING

(75) Inventors: Christophe Cordier, Ifs (FR); Jean Patrick, Vaux sur Seulles (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 66 days.

(21) Appl. No.: 09/913,442

(22) PCT Filed: Dec. 8, 2000

(86) PCT No.: PCT/EP00/12371

§ 371 (c)(1),
(2), (4) Date: Aug. 14, 2001

(87) PCT Pub. No.: WO01/45260

PCT Pub. Date: Jun. 21, 2001

(30) Foreign Application Priority Data

Dec. 14, 1999 (FR) .............................. 99 15757

(51) Int. Cl.[7] ................................ H02H 9/06
(52) U.S. Cl. .................................... 361/118
(58) Field of Search ............... 361/118; 327/407, 327/408, 409, 410

(56) References Cited

U.S. PATENT DOCUMENTS 3,904,977 A * 9/1975 Barsotti ................. 330/51
5,017,813 A * 5/1991 Galbraith ................. 307/475
5,654,660 A * 8/1997 Orgill et al. ............. 327/407
5,789,966 A * 8/1998 Bechade ................. 327/407

OTHER PUBLICATIONS

Greg Schoffer, Monolithic CMOS Video mux/amp pushes 50 Mhz, Electronic Engineering, Oct. 1987, pp. 43, 44, 48, 52.*

* cited by examiner

Primary Examiner—Gregory J. Toatley, Jr.
Assistant Examiner—Z Kitov
(74) Attorney, Agent, or Firm—Steven R. Biren

(57) ABSTRACT

The invention relates to an electronic component comprising a package PACK including input pins PIi and output pins PSj, and an integrated circuit IC, encased in the package PACK, which integrated circuit is provided with input contact pads CIi and output contact pads CIj, which are connected, respectively, to the input pins PIi and the output pins PSj of the package PACK by conducting wires WIi and WSj. In accordance with the invention, each current path connecting an input contact pad CIi to an output contact pad CIj comprises a buffer element Bi having a high input impedance. Said high input impedance of the buffers substantially reduces the value of the current Ii flowing through the conducting wires WIi connecting the input pins PIi to the input contact pads CIi, and hence the inductive coupling between said conducting wires.

4 Claims, 1 Drawing Sheet

ELECTRONIC COMPONENT WITH REDUCED INDUCTIVE COUPLING

FIELD OF THE INVENTION

Figure 1:
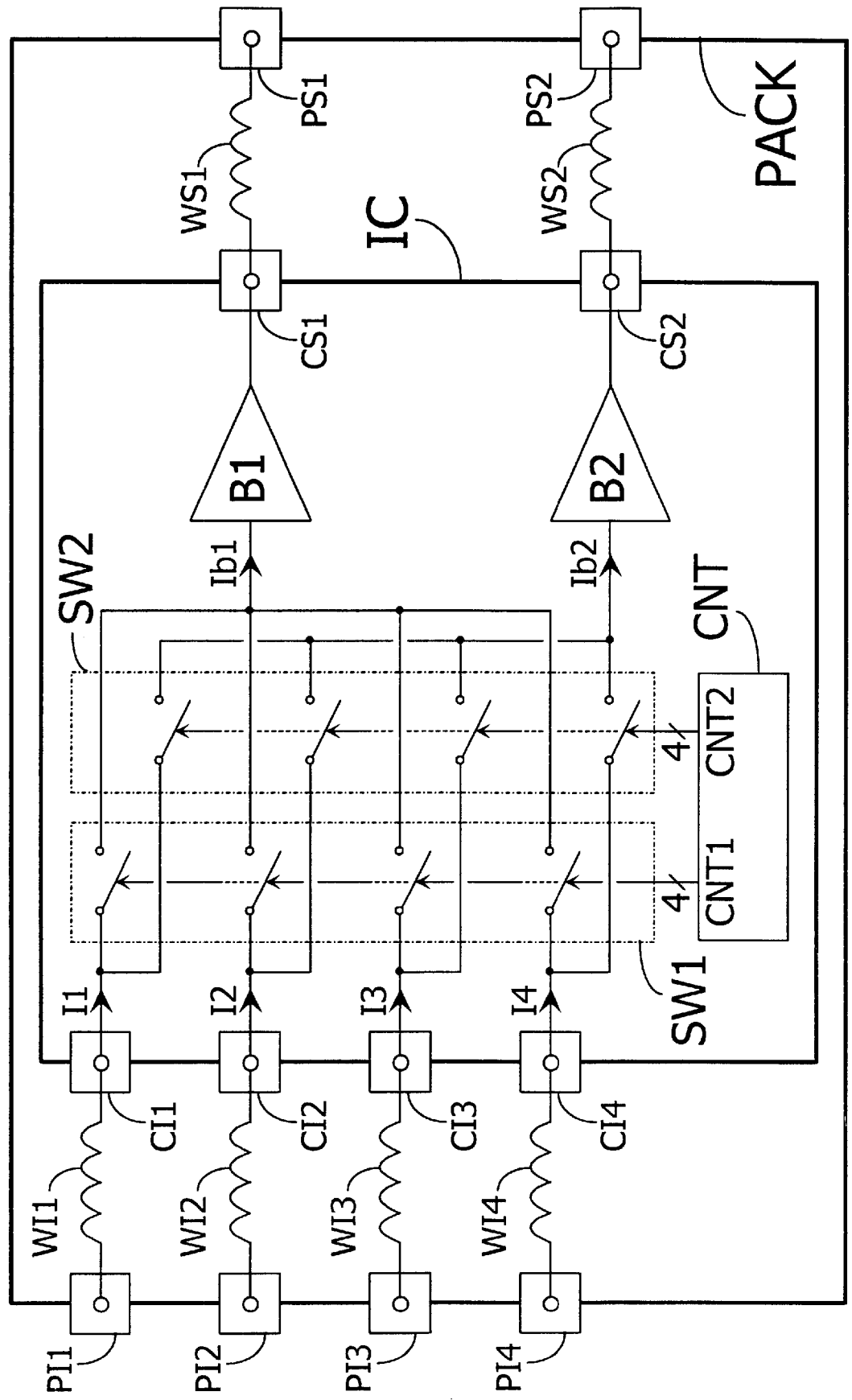

The invention relates to an electronic component comprising:
- a package having N input pins and M output pins, which are intended, respectively, to receive and supply data signals, and
- an integrated circuit, which is encased in said package, and which includes N input contact pads and M output contact pads, which are connected, respectively, to the N input pins and M output pins by conducting wires, which integrated circuit includes a plurality of current paths, which are each used to connect an input contact pad to an output contact pad.

BACKGROUND

It has been observed by the current applicant that during operation of such an electronic component, certain output pins supply data signals containing parasitic components, which do not correspond to any of the data signals received by those input contact pads which are electrically connected to said output pins. The current applicant has concluded that such phenomena are caused by inductive coupling between the various conducting wires connecting the input pins to the input contact pads: due to mutual inductance effects, components representative of signals carried by wires adjoining the wire under consideration are introduced into the signal carried by said wire under consideration. These additional components are contained in the signal which will be supplied by the output pin(s) which is (are) electrically connected to the wire under consideration, and will then constitute a parasitic component in said signal. The extent of the effects of mutual inductance is wider as the frequency of the data signals is higher.

SUMMARY

It is an object of the invention to overcome this drawback to a large extent by providing an electronic component wherein the effect of the inductive couplings between conducting wires connecting the input pins to the input contact pads are reduced substantially.

Indeed, in accordance with the invention each current path in an electronic component in accordance with the opening paragraph comprises a buffer element, exhibiting a high input impedance.

In such an electronic component, the high input impedances of said buffers cause the value of the currents flowing through the current paths upstream from the buffers, and hence the value of the currents flowing through the conducting wires connecting the input pins to the input contact pads, to be negligibly small. The extent of the mutual inductance phenomena occurring between adjacent wires, which is directly proportional to the value of the currents flowing through these wires, is thus reduced considerably, thereby precluding that a wire induces an additional component of substantial amplitude in the signal traveling through an adjacent wire. By virtue of the invention, each output pin thus supplies a signal which is representative only of signal contributions arriving at the input contact pads which are effectively electrically connected to said output pin, which signal consequently does not contain the parasitic component described hereinabove.

The buffers are advantageously composed of amplifiers, whose input impedance is naturally high, for example an assembly based on a Darlington-type structure.

In accordance with a particular embodiment of the invention, each input contact pad is connected to a buffer. This ensures that all currents flowing through the conducting wires connecting the input pins to input contact pads are negligibly small.

Although the invention can be employed in any type of electronic component comprising at least two input pins, the invention is advantageously used in multiplexers intended to receive and supply signals at very high frequencies, for example in the gigahertz range.

Thus, in a preferred embodiment of the invention, an electronic component as described hereinabove includes:
- M buffer elements, each having an input and an output, the latter being connected to one of the output contact pads,
- M switching stages, each comprising N switches, each switch having a first terminal and a second terminal, the first terminal being connected to one of the input contact pads, and all the second terminals being jointly connected to the input of one of the buffers, and
- control means for controlling the switching stages, which are arranged in such a way that only one of the switches included in a same switching stage can be conductive at any given instant.

This structure, which is used for multiplexing, by selecting M data signals from the N signals received on the input pins in order to direct these signals towards the M output pins, only requires M buffer, instead of the N buffers, which would have been necessary in accordance with the particular embodiment described hereinabove.

DETAILED DESCRIPTION

These and other aspects of the invention will be apparent from and elucidated with reference to the non-limitative exemplary embodiment described in FIG. 1, which is a functional diagram showing an electronic component in accordance with a preferred embodiment of the invention. This component comprises:
- a package PACK provided with four input pins PIi (i=1 to 4) and two output pins PSj (j=1 or 2), which are used, respectively, to receive and to supply data signals, and
- an integrated circuit IC, encased in the package PACK, and provided with four input contact pads CIi (i=1 to 4) and two output contact pads CSj (j=1 or 2), which are connected, respectively, to four input pins PIi and two output pins PSj by conducting wires WIi.

In this example, the integrated circuit IC comprises:
- two buffer elements B1 and B2, each having an input and an output, the latter being connected to one of the output contact pads CS1 and CS2,
- two switching stages SW1 and SW2, each comprising four switches, and each switch having a first terminal and a second terminal, the first terminal being connected to one of the input contact points CIi (i=1 to 4), and all the second terminals being jointly connected to the input of one of the buffers B1 or B2, and
- control means CNT for controlling the switching stages SW1 and SW2, which are arranged in such a way that only one of the switches included in a same switching stage can be conductive at any given instant.

To this end, the control means CNT supply two control signals CNT1 and CNT2 to the switching stages SW1 and SW2, which control signals are coded on four bits, and one of said control signals is in the active mode, for example at a logic level 1, at a given instant.

The switches included in the switching stages SW1 and SW2 can be implemented by means of MOS-type transistors or any other equivalent components. In an electronic component deprived of buffers B1 and B2, if for example, the control means CNT activate that switch of the first switching stage SW1 which is arranged between the input contact pad C11 and the output contact pad CS1, thereby producing a current path between these contact pads, then a current 11 flows through the conducting wire W11. If the control means CNT simultaneously activate that switch of the second switching stage SW2, which is arranged between the input contact pad C12 and the output contact pad CS2, thereby producing a further current path between the contact points, then a current 12 flows through the conducting wire W12. The two currents 11 and 12 then create a mutual inductance between the conducting wires W11 and W12, and the signal supplied by the output pin PS1 will contain a parasitic component that is representative of the current 12, while the signal supplied by the output pin PS2 will contain a parasitic component that is representative of the current 11.

In the electronic component in accordance with the invention, the buffers B1 and B2, which exhibit a large input impedance, render the currents 11 and 12 negligibly small, and thereby considerably reduce the effects of the mutual inductance phenomenon occurring between the conducting wires W11 and W12. The output signals supplied by the output pins PS1 and PS2 thus will contain no significant parasitic component representative of, respectively, the currents 12 and 11.

In this preferred embodiment of the invention, the buffers B1 and B2 are arranged in such a way that one of them is present in all possible current paths between the input contact pads and the output contact pads, so that the provision of a buffer downstream from each input contact pad can be dispensed with, thus enabling the necessary number of buffers to be reduced by a factor of $M/N=\frac{1}{2}$.

Mutual inductance phenomena of the type described hereinabove may occur between the conducting wires WSj interconnecting the output contact pads CSj and the output pins PSj. However, in many types of applications, such as the multiplexing carried out by the electronic component described in this exemplary embodiment of the invention, the output pins PSj will be smaller in number than the input pins PIi. It will thus be possible, in principle, to space out these output pins PSj by distributing them at the periphery of the package PACK, so that the mutual inductance between the conducting wires WSj cannot have significant effects owing to the space between said conducting wires. If such a distribution is impossible, the output pins PSj will advantageously be connected to buffers having a high input impedance, arranged outside the package PACK, and not shown in the drawing.

What is claimed is:

1. An electronic component comprising:

a package having N input pins and M output pins, which are intended, respectively, to receive and supply data signals, and an integrated circuit, which is encased in said package, and which includes N input contact pads and M output contact pads, which are connected, respectively, to the N input pins and M output pins by conducting wires, which integrated circuit includes a plurality of current paths, which are each used to connect an input contact pad to an output contact pad, in which electronic component each current path comprises a buffer element, exhibiting a high input impedance, wherein each buffer element substantially reduces a mutual inductance phenomena occurring between adjacent conducting wires.

2. An electronic component as claimed in claim 1, wherein each input contact pad is connected to a buffer.

3. An electronic component as claimed in claim 1, wherein the integrated circuit includes:

M buffer elements, each having an input and an output, the latter being connected to one of the output contact pads, M switching stages, each comprising N switches, each switch having a first terminal and a second terminal, the first terminal being connected to one of the input contact pads, and all the second terminals being jointly connected to the input of one of the buffers, and control means for controlling the switching stages, which are arranged in such a way that only one of the switches included in a same switching stage can be conductive at any given instant.

4. An electronic component as claimed in claim 1, wherein the buffers are amplifiers.

* * * * *